(12) United States Patent
Benaissa

(10) Patent No.: US 9,777,393 B2
(45) Date of Patent: Oct. 3, 2017

(54) METHOD FOR PRODUCING A SINGLE-CRYSTALLINE LAYER

(71) Applicant: COMMISSARIAT A L'ENERGIE ATOMIQUE ET AUX ENERGIES ALTERNATIVES, Paris (FR)

(72) Inventor: Lamine Benaissa, Giéres (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 172 days.

(21) Appl. No.: 14/415,980

(22) PCT Filed: Jul. 15, 2013

(86) PCT No.: PCT/FR2013/051688
§ 371 (c)(1),
(2) Date: Jan. 20, 2015

(87) PCT Pub. No.: WO2014/013173
PCT Pub. Date: Jan. 23, 2014

(65) Prior Publication Data
US 2015/0191847 A1 Jul. 9, 2015

(30) Foreign Application Priority Data

Jul. 17, 2012 (FR) ...................... 12 56898

(51) Int. Cl.
*C30B 13/00* (2006.01)
*H01L 21/02* (2006.01)
*C30B 13/24* (2006.01)

(52) U.S. Cl.
CPC ............ *C30B 13/005* (2013.01); *C30B 13/24* (2013.01); *H01L 21/02488* (2013.01);
(Continued)

(58) Field of Classification Search
CPC combination set(s) only.
See application file for complete search history.

(56) References Cited

U.S. PATENT DOCUMENTS

| | | | | |
|---|---|---|---|---|
| 4,046,618 A | * | 9/1977 | Chaudhari | ............... C30B 1/02 117/8 |
| 4,383,883 A | * | 5/1983 | Mizutani | ................... C30B 1/02 117/43 |

(Continued)

FOREIGN PATENT DOCUMENTS

TW 200826195 A 6/2008

OTHER PUBLICATIONS

Oct. 31, 2013 International Seach Report issued in Application No. PCT/FR2013/051688.
(Continued)

*Primary Examiner* — Duy Deo
*Assistant Examiner* — Erin Bergner
(74) *Attorney, Agent, or Firm* — Oliff PLC

(57) ABSTRACT

Process for fabricating a thin single-crystalline layer n, including steps of: a) providing a support substrate n, b) placing a seed sample n, c) depositing a thin layer n so as to form an initial interface region n including a proportion of seed sample n and a proportion of thin layer n, the proportion of seed sample n decreasing from the first peripheral part n towards the second peripheral part n, e) providing an energy input to the initial interface region n contiguous to the first peripheral part n so as to liquefy a portion n of the thin layer and form a solid/liquid interface region n, and f) gradually moving the energy input away from the seed sample n so as to solidify the portion n so as to gradually move the solid/liquid interface region n.

20 Claims, 4 Drawing Sheets

(52) U.S. Cl.
CPC .. *H01L 21/02532* (2013.01); *H01L 21/02658* (2013.01); *H01L 21/02678* (2013.01); *H01L 21/02686* (2013.01); *H01L 21/02691* (2013.01); *Y10T 428/12674* (2015.01)

(56) References Cited

U.S. PATENT DOCUMENTS

| | | | |
|---|---|---|---|
| 4,559,086 A * | 12/1985 | Hawkins | H01L 21/3221 |
| | | | 148/33.2 |
| 2004/0255845 A1 | 12/2004 | Voutsas et al. | |
| 2008/0214021 A1 | 9/2008 | Tanaka et al. | |
| 2010/0304035 A1 * | 12/2010 | Zehavi | C23C 4/134 |
| | | | 427/450 |

OTHER PUBLICATIONS

Saputra et al. "An Assessment of m-Czochralski, Single-Grain Silicon Thin-Film Transistor Technology for Large-Area, Sensor and 3-D Electronic Integration", IEEE Journal of Solid-State Circuits, vol. 43, No. 7, pp. 1563-1576, 2008.

LaRoche et al. "Monolithically Integrated III-V and SI CMOS Devices on Silicon on Lattice Engineered Substrates (SOLES)", CS Mantech Conference, 2009.

* cited by examiner

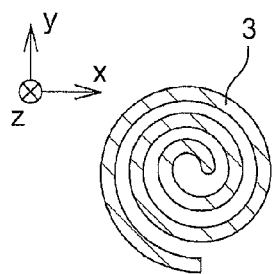
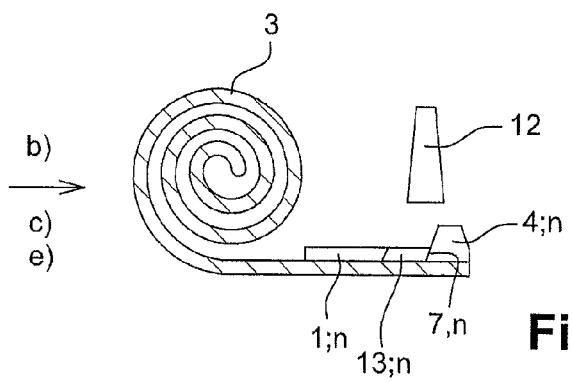
Fig. 16  Fig. 17
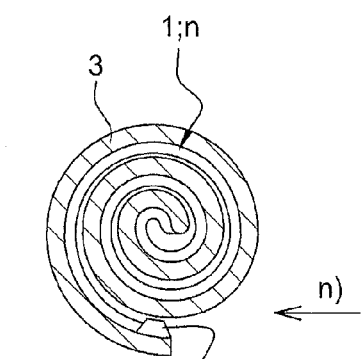
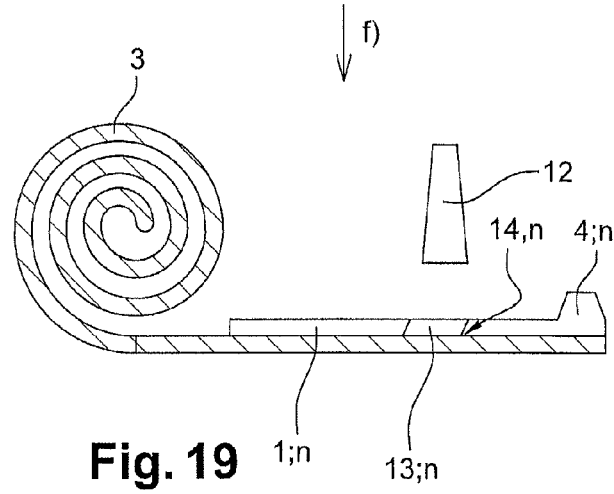
Fig. 18  Fig. 19
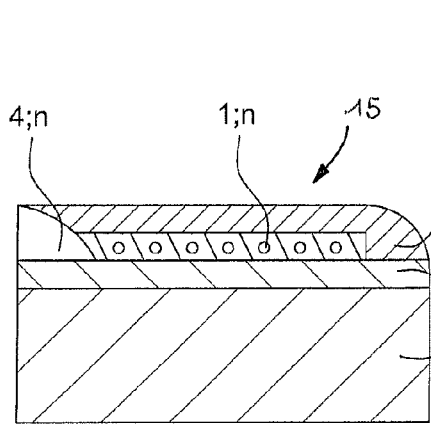
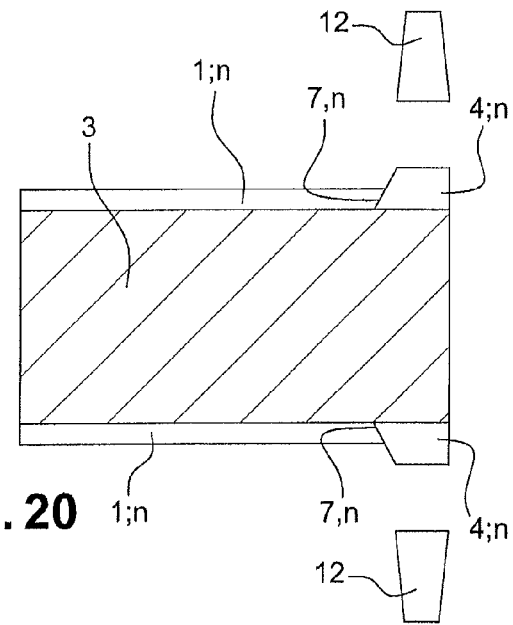
Fig. 15  Fig. 20

METHOD FOR PRODUCING A SINGLE-CRYSTALLINE LAYER

The present invention relates to a method for producing a single-crystalline layer, in particular in a semi-conductor material, intended for applications in the fields of microelectronics, micro-systems, photovoltaics, display or storage of data. Moreover, the present invention relates to a composite structure suitable for obtaining a single-crystalline layer in particular in a semi-conductor material by applying this method of producing.

In the field of semi-conductor materials, it is advantageous to form electronic devices on or in thin films constituted of a single-crystalline material disposed on a support substrate. A layer of electric insulating material is furthermore advantageously disposed between the single-crystalline layer and the support substrate.

It is known several methods for obtaining such substrates but these methods are expensive or do not allow obtaining layers of sufficient crystalline quality for the high performances of the aimed applications.

For example techniques of epitaxial lateral overgrowth (ELO) and Merged Epitaxial Lateral Overgrowth (MELO) ensure the growth of a thin layer on a seed substrate, by means of openings formed in an electric insulating growth mask. It is thus possible to obtain localized structures of Silicon On Insulator (SOI) type by this means. In order to do this, a silicon seed support substrate exhibiting on the surface a layer of amorphous silicon oxide is first formed. Then, openings in the amorphous layer are obtained by etching in such a manner as to form a growth mask. First, a vertical growth of single-crystalline silicon pads is achieved from the silicon seed substrate in the formed openings. Then, when the silicon pads emerge from the surface of the mask, the deposition conditions are modified in such a manner as to obtain a vertical and lateral growth of silicon to cover the totality of the SiO2 mask. However, this selective epitaxial growth (SEG) remains a sensitive and rather tricky method to achieve. When the epitaxial fronts from the vertical growth of silicon pads meet, crystalline defects are formed. Furthermore, the surface of the thin layer obtained is not planar and requires a step of mechanical-chemical polishing to remove excess silicon. Furthermore, the width of the patterns of SOI type achieved is limited by the low ratio of lateral/vertical growth (estimated at around 1:10), so much so that the dimensions of the SOI pads obtained do not exceed 500 μm.

Furthermore, these techniques require the use of a single-crystalline seed initial substrate of the same material as that of the thin layer thus leaving little alternative as to the nature of the support substrate. Hence, it is impossible for example to produce a silicon layer on a glass substrate SOG (Silicon On Glass) by these lateral growth methods.

Another known technique consists in re-crystallizing a polycrystalline film deposited on a support substrate. This method called ZMR (zone melting recrystallization) is based on the use of mobile energy allowing local liquefaction of a polycrystalline layer deposited by the aforementioned ELO technique. After the passage of the energy source, the melted area cools off. The area in contact with the seed substrate recrystallizes according to the crystal information of the latter and leads to a single-crystalline film. However, in practice the films obtained are of low quality as the presence of the mask and seed areas create differences in thermal dissipation. In fact, the thermal conductivity of a SiO2 mask is for example around 100 times lower than that of the silicon support. Hence, the energy source horizontally sweeps over a region exhibiting a vertical discontinuity of thermal resistance. In these conditions, it becomes difficult to control the crystallization front and a local coexistence of solid and liquid areas creates an accumulation of constraints leading to the appearance of crystalline defects.

It is also possible to apply the ZMC technique (acronym for Zone Melting Crystallization) for crystallizing an amorphous film deposited on a single-crystalline seed substrate according to the same principle as that of the ZMR method. The drawback of these two methods is that it is essential that the seed support substrate comprises a single-crystalline material and preferably of the same nature as that of the thin layer. It is thus impossible to attain a single-crystalline silicon film based on an amorphous glass support substrate for example. In short, the ZMR\ZMC approach is a low-cost method, compatible with large dimensions but only produces average quality crystalline films.

It is also known another technique of recrystallization LEGO (Lateral Epitaxial Overgrowth) combining the ELO and ZMR technology. An SiO2 mask is formed on a single-crystalline silicon substrate revealing seed areas as in the ELO approach. A non-selective epitaxy is achieved on the structure allowing the growth of single-crystalline silicon from the seed areas and the formation of polycrystalline silicon everywhere else. The use of a mobile source of energy will lead to a recrystallization with the creation of defects similar to the ZMR approach such that a stable source of heat which allows a simultaneous recrystallization of the entire film is preferred. Thus, even if the LEGO method allows overcoming the lateral growth limitation of the film (feature of the ELN method), its implementation on a large surface (200 mm wafer, for example) becomes difficult. In fact, in order to constrain the whole film to comply with the required crystalline structure, it is important to multiply the seed areas. The joining of the different solidification fronts generates defects. Moreover, the liquefaction of the entire surface inevitably creates thermomechanical constraints over the entire substrate. This phenomenon worsens when increasing the work dimensions.

Finally, another known technique (in particular from document TW200826195) consists in depositing a thin non-crystalline film on a substrate. A seed sample is then adhered to the film at one of the ends thereof. A laser beam illuminating through the substrate at the absorption wavelength of the semi conductor film then sweeps the thin film by starting by the end where the seed material is stuck such that the film liquefies then crystallizes/recrystallizes while cooling on the surface in contact with the seed. It is difficult in this configuration to monitor the solidification front which may affect the crystalline quality of the thin film. Furthermore, it is essential that the substrate be transparent at the wavelength of the laser, thus limiting the possible choices.

Thus, the known methods do not allow providing single-crystalline semiconductor layers of material of high crystalline quality and large dimensions at low cost. Moreover, the constraints inherent to these methods do not allow a wide choice in the nature and quality of support substrates.

One of the purposes of the invention is to overcome one or several of these drawbacks. With this regard, and according to a first aspect, the invention relates to a method for producing a thin single-crystalline layer n, in particular for applications in the fields of microelectronics, photovoltaics, display, micro-systems, data storage, the method comprising the steps consisting in:

a) providing a support substrate comprising a planar surface, b) placing a seed sample n in single-crystalline material exhibiting a crystalline information, on the planar surface, n being an integer different from zero, c) depositing a thin layer on the planar surface such as to form an initial interface region comprising a proportion of seed sample n and a proportion of thin layer n the initial interface region n being framed on either side and in parallel with the planar surface, of a first peripheral part n comprising only the seed sample n and a second peripheral part n comprising only the thin layer n the proportion of seed sample n according to the axis perpendicular to the planar surface, decreasing from the first peripheral part n towards the second peripheral n part, e) providing energy to the initial interface region n contiguous to the first peripheral part n such that the energy is locally absorbed by the thin layer n in order to locally liquefy a portion n of the thin layer n the initial interface region n substantially becoming a solid-liquid interface region n and f) ensuring a relative displacement of the input energy and the support substrate, in parallel with the planar surface, by gradually moving the energy input and seed sample n away in order to solidify the portion n previously liquefied upstream of the energy input according to the crystalline information of the seed sample n and in such a manner as to gradually move the solid-liquid interface region n within the thin layer n.

In the present application, the expression "crystalline information" means the crystalline features of the seed sample n such as the symmetry of the Bravais lattice, the lattice parameter of the crystals, the atoms composing them.

In the present application, the expression "planar surface" of the support substrate means a substantially planar surface, that is to say, exhibiting a surface of which the topology does not risk trapping or promoting the agglomeration of liquefied material, in such manner as to promote good wetting.

In addition, in the present application, the expression "seed sample" means a portion of material different from a continuous layer and serving as seed for the formation of a single crystal material.

It is understood that in the present application the proportion of seed sample n and proportion of thin layer n are measured along the y axis, perpendicular to the planar surface of the support substrate.

Furthermore, it is also understood that the proportion of seed sample n decreases with the distance separating the first peripheral part n of the second peripheral part in the present application.

In the present application, the term "the first peripheral part n and the second peripheral n" framing the initial interface region n is defined along the x axis, parallel with the planar surface of the substrate and corresponding to the displacement axis of the energy input or the support substrate with respect to the energy input.

It is meant in the present application by the expression "the initial interface region" the totality of the contact surface between the seed sample n and the thin layer n.

It is also meant in the present application by the expression "the initial interface region "substantially" becoming a solid-liquid interface region" the possibility that as a result of the heat generated by the local melting of the thin layer n, a small proportion of the seed sample n of the interface region n starts melting. The solid-liquid interface n may thus be slightly offset in a direction parallel with the planar surface compared to the initial interface region n. However, the configuration of the solid-liquid interface n remains identical to that of the initial interface region n that is to say that the proportion of seed sample n also decreases from the first peripheral part n to the second peripheral part n in the solid-liquid interface n in such a manner as to facilitate the transfer of the crystalline information.

Furthermore, the expression "ensuring a relative displacement of the energy input and the support substrate" in the present document means that the energy input is movable with respect to the stationary support substrate or that the support substrate is movable and is displaced with respect to the energy input or even that the support substrate and the energy input are moveable and that their remoteness progresses.

Thus, the method of the invention allows the monitored crystallization of a thin layer n based on the crystalline information of a seed sample n. The specific configuration of the interface region between the seed sample n and the thin layer n allows in fact to procure a large contact surface between the thin layer n and the crystalline information of the seed n. This configuration also allows obtaining an interface favorable to wetting unlike an interface which would be strictly vertical. The energy input is absorbed locally in the thin layer n in such a manner as to create sufficient thermal agitation for locally liquefying the thin layer n. The input remains localized in such a manner that upstream of this input, the thermal agitation is limited and that solidification occurs. Initially, the solid-liquid interface is created at the interface between the seed sample n and the thin layer n. Combined with the displacement of the energy input, this solid-liquid interface is displaced in a substantially parallel manner with the planar surface of the support substrate by liquefying and then locally crystallizing a portion of the thin layer n according to the crystalline information of the seed sample n, in such a manner that a single-crystalline layer of high quality may be obtained. The portion thus crystallized of the thin layer n acts as if it extended the seed sample n by transmitting its crystalline information to the liquefied portion n of the thin film n during the solidification thereof. Moreover, in this specific configuration, the specific displacement of the energy input allows the creation of one single solidification and crystallization front preventing the formation of crystalline defects from the meeting of several fronts. Furthermore, the configuration of the initial interface region n is such that a small quantity of single-crystalline seed material is sufficient for achieving the method, thus limiting the producing costs. This configuration of the interface also allows proceeding with the crystallization of several stacked thin layers n; n+1 in order to obtain single-crystalline layers n; n+1 with one single seed sample n.

Finally, the method is adaptable to a wide range of materials to be crystallized, in particular all materials which can be heated locally and selectively with respect to the substrate on which the material is deposited.

Advantageously, the interface between the seed sample n and the thin layer n is substantially oblique with respect to the planar surface of the support substrate and to the direction of displacement of the energy input, this interface may be rectilinear or non rectilinear.

Preferably, the proportion of seed sample n of the initial interface region n decreases continuously from the first peripheral part n to the second peripheral part n, thus promoting the propagation of the crystalline information to the solidification front of the thin layer n.

According to one possibility, the step a) comprises a step of forming a buffer layer n on the planar surface of the support substrate on which the thin layer n is deposited, the buffer layer n exhibiting an amorphous material at the interface with the thin layer n. Thus, the surface on which the thin layer n is crystallized does not offer crystallization sites liable to parasitize the crystallization of the thin liquefied layer n.

Preferably, the material of the buffer layer n is a thermal insulator. This allows confining the energy input in the thin layer n. In such a manner, the temperature required in the thin layer n is easily attainable, and considering the very low thermal diffusion, the temperature is maintained well and promotes the liquefaction of the layer n. The thickness of the buffer layer n may be modulated based on the reached temperature in such a manner as to always form a thermal barrier. This allows using a wide range of support substrate material and in particular using low cost substrates and exhibiting large dimensions without the latter becoming damaged or becoming deformed as a result of the heat.

According to an alternative, the planar surface of the support substrate comprises an amorphous material on which the thin layer n is deposited, in such a manner that it is not necessary to provide a specific buffer layer n.

Advantageously, the step c) consists in depositing the thin layer n in the form of an amorphous material. Thus, contrary to a layer of polycrystalline material, the thin layer n is homogenous and reacts in an identical fashion to the energy input in every point. Thus, it is easy to ensure that the fusion of the portion n of the thin layer n is locally complete, contrary to a thin polycrystalline layer of which the grain boundaries locally affect the energy absorption. Furthermore, the deposition of the thin amorphous layer n requires a temperature less high than the deposition of a polycrystalline layer such that the deposition costs are less high. Moreover, an amorphous layer liquefies at a lower temperature than a polycrystalline layer and a fortiori crystalline of the same material. Thus, if the seed n is of the same material as the thin amorphous layer n, it is more easily preserved.

According to the targeted applications, the thin layer n is achieved in a semi-conductor material.

The energy input is hence advantageously generated by means of a radiation of wavelength suitable to be absorbed in the thin layer n.

According to an alternative, the energy input is generated by magnetic or electric excitation, in particular when the material of the thin layer n is a ferromagnetic or ferroelectric material, for example an oxide of perovskite structure, for which a magnetized bar may serve as localized energy input.

Typically, the energy input is achieved by means of at least one source of radiation which is selected from among an electron gun or a laser of which the beam exhibits a maximum intensity on the region to be liquefied. This allows ensuring the efficient propagation of the crystalline information of the seed sample n. The beam of the laser exhibiting a very precise wavelength and when the material of the thin layer n is a semi-conductor, it exhibits a band gap with an also very precise energy, the laser may be selected such that the emitted wavelength coincides as best as possible with that absorbed by the material of the thin layer n. Thus, the irradiation is specifically and efficiently absorbed by the thin layer n.

Preferably, the power of the energy input is adjusted in such a manner as to locally liquefy the thin layer n over the entire thickness thereof while limiting the impact on the environment of the thin layer n, such as the support substrate.

Typically, the seed sample n comprises a material of identical symmetry and a lattice parameter different by less than 3% to those of the nominal material the thin crystallized layer n. This prevents the constraints liable to cause the formation of defects, of which dislocations, blocking the transmission of the crystalline information of the seed n during crystallization.

Preferably, the seed sample n comprises a material identical to that of the thin layer n in such a manner as to obtain a perfect match of lattice parameter and a thin layer n of very good crystalline quality.

According to a disposition of the invention, the method comprises between the step c) and the step e) a step d) consisting in depositing and arranging a confining layer n on the thin layer n in such a manner as to isolate the thin layer n from the atmosphere and promote the propagation of the crystalline information. This confining layer n in fact prevents the superficial oxidation of the thin layer n in contact with the atmosphere and promotes the monitoring of the crystallization process by preventing the agglomeration of the material of the thin layer n when it is in liquid form.

Typically, the material of the confining layer n does not absorb the energy input in such a manner that the layer n remains solid. When the energy is for example provided by radiation, the wavelength is such that it is not absorbed by the material of the confining layer n such as to not be liquefied.

According to an implementation, the confining layer n absorbs less than 10% of the focused energy. Thereby, the loss of efficiency of the method during the application of the energy through the confining layer n is limited.

According to an alternative, the confining layer n is typically achieved of at least one material of which the melting temperature is higher than that of the material of the thin layer n in such a manner as to remain solid during the energy input and not interfere in the crystallization process.

Advantageously, the confining layer n exhibits an amorphous material at the interface with the thin layer n.

Preferably, the confining layer n is deposited in the form of an amorphous material in such a manner as to limit the deposition costs and not exhibit parasitic nucleation sites for the crystallization of the thin layer n.

Advantageously, the method also comprises the steps consisting in:

g) forming a buffer layer n+1 on the thin layer n in such a manner that the surface opposite the thin layer n of the buffer layer n+1; exhibits an amorphous material, h) placing a seed sample n+1 on the buffer layer n+1;

i) depositing a thin amorphous layer n+1 on the buffer layer n+1 the buffer layer n+1 exhibiting an amorphous material at the interface with the thin layer n+1 such as to form an initial interface region n+1 with the seed sample n+1 the initial interface region n+1 comprising a proportion of seed sample n+1 and a proportion of thin layer n+1 the initial interface region n+1 being framed on either side and parallel with the planar surface, of a first peripheral part n+1 comprising only the seed sample n+1 and a second peripheral part n+1 comprising only the thin layer n+1 the proportion of seed sample n+1 along the axis perpendicular to the planar surface, decreasing from the first peripheral part n+1 towards the second peripheral part n+1, j) providing an energy to the initial interface region n+1 contiguous to the first peripheral part n+1 in such a manner that the energy is locally absorbed by the thin layer n+1 in order to liquefy locally a portion n+1 of the thin layer n+1, the initial interface region n+1 substantially becoming a solid-liquid interface region n+1, and k) ensuring a relative displacement of the energy input and the support substrate parallel with the planar surface by gradually moving the energy input and the seed sample n+1 away in order to solidify the portion n+1 which has already been liquefied upstream of the energy input according to the crystalline information of the seed sample n+1 and in such a manner as to gradually displace the solid-liquid interface region n+1 within the thin layer n+1.

It is understood that in the present application, the index n applies to a thin layer n and to the layers framing the thin layer n, such as the buffer layer n and/or the confining layer n. Likewise for the index n+1.

Thus, thanks to this method, it is possible to form a stacking of two thin layers n and n+1 of single-crystalline material of different or identical nature.

Advantageously, the thin layer n and the thin layer n+1 are constituted of a semi-conductor, ferromagnetic or ferroelectric material.

The buffer layer n+1 exhibiting at the interface with the thin layer n+1 an amorphous material, the surface on which the thin layer n+1 is crystallized does not offer crystallization sites liable to parasitize the crystallization of the thin liquefied layer n+1.

According to a disposition, the step i) comprises the deposition of a confining layer n+1 on the thin layer n+1, in such a manner as to isolate the thin layer n+1 from the atmosphere. This confining layer n+1 prevents the superficial oxidation of the thin layer n+1 in contact with the atmosphere and promotes the monitoring of the crystallization process by preventing the agglomeration of the material of the thin layer n+1 when it is in liquid form.

According to a possibility, the buffer layer n+1 is formed by a confining layer n of the thin layer n and of which the surface opposite the thin layer n exhibits an amorphous material.

Alternatively, the buffer layer n+1 is deposited on the confining layer n of the thin layer n.

According to yet another alternative, the step f) also comprises a step of total or partial removal of the confining layer n after complete solidification of the thin layer n and a buffer layer n+1 is deposited on the thin layer n or on the residue of the confining layer n.

Advantageously, the melting temperature of the material of the buffer layer n is higher than that of the material of the thin layer n in such a manner as to prevent the melting of the buffer layer n during the liquefaction of the thin layer n.

Preferably, the buffer layer n and/or n+1 is achieved in at least an electric insulating material in such a manner as to fabricate thin layers n and/or n+1 of single-crystalline materials on insulator, advantageously used in applications in the fields of microelectronics, photovoltaics, display or storage of data.

According to an alternative embodiment the seed sample n+1 is formed by the seed sample n. The producing costs are thereby reduced. In fact, in the case where the thickness of the seed sample n is higher than that of the thin layer n, the seed sample n may emerge from the surface during the deposition of the thin layer n+1 in such a manner that it may again serve to form a new initial interface region with the thin layer n+1.

According to another alternative embodiment, the seed sample n+1 is deposited on the buffer layer n+1, the seed samples n and n+1 exhibit different natures of materials. Thus, the thin layers n and n+1 may exhibit different natures of materials.

According to an implementation, the thin layer n+1 is achieved in a material which is different from that of the thin layer n, such as respectively silicon and germanium. Hence, it is easy to form a stacking of two layers of single crystalline materials of different natures on a same substrate support. The producing method may hence be used to form structures with widely varied applications, in particular when the material of the thin layer n and/or the thin layer n+1 is a semi-conductor material.

According to another possibility, the method comprises a step l) consisting in repeating the steps g) to k), the integer n being incremented by a unit, in such a manner as to produce a stacking comprising a numerous superposition of single-crystalline materials, in particular semi-conductor materials.

According to a particular disposition, the thin layer n comprises first and second initial interface regions n with the seed sample n and in that the steps e) to f) and/or the steps j) to k) are achieved on the first initial interface region n in such a manner as to crystallize a first part of the thin layer n and form an extension of the seed sample in the continuity of the second initial interface region n then the steps respectively e) to f) and/or steps j) to k) are achieved on the second initial interface region n extended by the first crystallized part of the thin layer n in such a manner as to crystallize a second part of the thin layer n complementary to the first part.

It is thereby possible to produce a single-crystalline layer based on a seed sample n of which the dimensions along axis x and axis y are each lower than those of the support substrate. Thus, a large surface of single-crystalline layer may be formed with a small quantity of seed sample n with a very limited cost.

According to a possibility, the seed sample n is produced by micro-machining the support substrate in such a manner that it is not necessary to bond the seed sample to the support substrate.

According to an alternative, the step b) or g) comprises a step of structuring of a substrate of single-crystalline material by micro-machining or lithography and etching in such a manner as to form at least one seed sample n and a step consisting in placing the seed sample n on the support substrate. This allows fashioning several seed samples n simultaneously and thereby limiting the costs.

According to another alternative, the step b) and/or g) comprises bonding a substrate of single-crystalline material on the support substrate then chemical etching in such a manner as to attain the required geometric configuration for forming an initial interface region n such as described beforehand. The seed sample n being single-crystalline, for a same crystalline symmetry, an isotropic or anisotropic chemical etching is possible such that different geometric configurations may be obtained. It is understood from the present application that the bonding of the substrate of single-crystalline material may be directly carried out in contact of the planar surface of the support substrate as on one or several layers of material already present on the planar surface of the support substrate.

In the same manner, a physical machining of the seed sample n may be achieved before or after the disposition thereof on the support substrate n.

According to a possibility, the step b) and/or g) consists in a direct bonding of the seed sample n and n+1 on the support substrate. It is understood in the present application that the expression "direct bonding" means a bonding by molecular adhesion, opposed to the bonding using adhesive layers, glue, etc, This direct bonding of the seed sample n and n+1 on the support substrate may be achieved directly in contact with the planar surface of the support substrate as in the contact of a layer such as a thin layer n, buffer layer n ( . . . ) present on the planar surface of the support substrate.

According to a particular disposition, the step c) comprises the deposition of a thin layer n comprising doping species, achieving steps e) and f) leading to electrically activate at least part of the doping species of the thin layer n.

Thus, it is possible to draw benefit from the specificities of the method for activating doping species introduced in the thin layer n simultaneously with crystallization.

In addition, the electric activation of the dopants according to this disposition is all the more efficient when proceeding with the activation at the melting temperature of the material of the thin layer.

Furthermore, during the use of an excimer laser which allows attaining very rapidly the melting temperature of the thin layer n (lower than the hundredth of a nanosecond) the doped material hardly remains at this temperature. Thus, the period of time during which the doping species may diffuse in the thin layer n is very short. Moreover, the focused characteristic of the laser beam on the spatial plane (dimensions which are laterally micrometric and nanometric in depth) confines the activation process within the thin layer n. In these conditions, the activated dopants are fixed in a stable manner in the crystalline structure of the thin layer n, the doping profile within the layer n is perfectly mastered, due to the low possibility of dopant diffusion. The sweeping of the thin layer n by laser successively allows treating the confined areas on the spatial plane fin order to finally crystallize and activate the set of dopants present in the entire thin layer n.

What is more, the deposition of a thin layer n with doping species allows varying the nature and/or the concentration of the doping species during the deposition of the thin layer n. Thus, it is easy to achieve a vertical stacking to the variable doping within the thin layer n, such as to form a vertical succession of junctions, once the electric activation and crystallization achieved.

According to an alternative, the step c) comprises a step of implanting doping species in the thin layer n, achieving of steps e) and f) leading to electrically activating at least part of the doping species of the thin layer n. Vertical stackings may thus be created in the thin layer n, just as a lateral variation of the profile of the dopant concentration may be obtained.

This method also allows obtaining a localized doping, allowing to later define areas of devices, such as a p-n junction for a diode or source and drain areas for MOS transistors.

According to another alternative, the doping of the thin layer n may be obtained by plasma immersion.

According to a possibility, the support substrate is a rigid substrate.

For example a rigid support substrate is a substrate which exhibits a thickness higher than 50 micrometers.

The planar surface of the support substrate may hence be constituted of the totality of the substrate surface.

The energy input is preferably carried out by sweeping the support substrate.

According to a possibility, the method comprises a step m) after the step f) consisting in carrying out collective surface treatments on the thin layer n.

According to an alternative, the step a) comprises a step consisting in providing a flexible substrate wound around itself such as to exhibit a general roller shape, followed by a step consisting in at least partially unwinding the flexible substrate in such a manner as to provide the support substrate comprising the planar surface.

The steps b) to f) may then be implemented based on this planar surface.

This alternative is advantageously compatible with a producing method of roll-to-roll type in which the substrate is initially wound and the produced assembly may also be wound at the end of the method. In this alternative, the flexible substrate is typically unwound and displaced continuously under fixed installations allowing in particular the deposition of the thin layer n and the energy input.

According to a possibility, the flexible substrate is constituted of a film of polymer, metal such as aluminum, or carbon.

According to an alternative, the flexible substrate is constituted of any substrate of which the thickness is lower than or equal to 50 micrometers.

According to a complementary disposition, the method comprises a step n) achieved after the step f) consisting in winding the assembly comprising the support substrate and the thin layer n on itself such that the assembly exhibits a general roller shape.

According to another disposition of the invention, the step a) consists in providing a support substrate comprising a first planar surface and a second surface, the step b) consists in placing a first seed sample n in single-crystalline material exhibiting a crystalline information on the first planar surface, and placing a second seed sample n in single-crystalline material exhibiting a crystalline information on the second planar surface, and the step c) consists in depositing a first thin layer n on the first planar surface, such as to form respectively a first initial interface region n comprising a proportion of the first seed sample n and a proportion of the first thin layer n, the first initial interface region n being framed on either side and in parallel with the first planar surface, of a first peripheral part n solely comprising the first seed sample n and a second peripheral part n solely comprising the first thin layer n, the first proportion of seed sample n, along the axis perpendicular to the first planar surface, decreasing from the first peripheral part n towards the second peripheral part n, and in depositing a second thin layer n on the second planar surface, in such a manner as to form respectively a second initial interface region n comprising a proportion of the second seed sample n and a proportion of the second thin layer n, the second initial interface region n being framed on either side and in parallel with the second planar surface, of a primary peripheral part n solely comprising the second seed sample n, and a secondary peripheral part n solely comprising the second thin layer n, the second proportion of seed sample n, along the axis perpendicular to the second planar surface, decreasing from the primary peripheral part n towards the secondary peripheral part n.

The cycle times for producing two thin crystalline layers n are hence clearly reduced.

Advantageously, the single-crystalline materials of the first and second seed samples n are different and the first and second thin layers n are constituted of different materials. It is hence possible to produce two thin single-crystalline layers n of a different material on a same support substrate with a producing time similar to the producing of one single thin single-crystalline layer n.

According to a disposition, the energy input is achieved using two sources of radiation disposed respectively on either side of the substrate in such a manner as to illuminate the first planar surface and the second planar surface.

According to a particular embodiment of the invention, the support substrate is in silicon, the buffer layer n is in SiO2, the thin layer n is in silicon, the confining layer n is in SiO2 and the energy input is achieved by a laser with a wavelength ranging from the infrared to the UV in such a manner as to form a thin single-crystalline layer n of silicon on insulator, of SOI type, which is particularly interesting for high performance microelectronic applications.

According to another particular disposition, the support substrate is in borosilicate glass, the thin layer n is in silicon, the confining layer n is in SiO2 and the energy input is achieved by a laser with a wavelength ranging from the infrared to the UV in such a manner as to form a thin single-crystalline layer n of silicon on glass SOG advantageously used in photovoltaic or display applications.

Advantageously, the thin layer n+1 is in silicon and the energy input is achieved by a UV laser such as to form a thin single-crystalline layer n+1 of silicon on insulator disposed on a thin layer n of single-crystalline germanium on insulator. The thin layer of single-crystalline germanium n being obtained beforehand based on a thin layer n of germanium and the energy input of a laser with a wavelength ranging from the infrared to the UV. This stacking of layers is advantageously used in applications such as described in the document of L. Benaissa and al., "Monolithically Integrated III-IV and Si CMOS Devices on Silicon on lattice engineered substrates (SOLES)", CS Mantech conference, May 18-21, 2009, Tampa, Fla., USA.

According to a second aspect, the invention relates to a composite structure suitable for obtaining a single-crystalline layer by focused energy input comprising:
a support substrate exhibiting a planar surface,
a buffer layer n disposed on the planar surface of the support substrate of which the surface opposed to the support substrate is in amorphous material,
a seed sample n of a single-crystalline material, exhibiting a crystalline information, disposed on the support substrate, a thin layer n disposed on the buffer layer n in such a manner as to comprise an initial interface region n with the seed sample n, the initial interface region n comprising, a proportion of seed sample n and a proportion of thin layer n, the initial interface region n being framed on either side and in parallel with the planar surface, of a first peripheral part n solely comprising the seed sample n and a second peripheral part n solely comprising the thin layer n, the proportion of seed sample n, along the axis perpendicular to the planar surface, decreasing from the first peripheral part n towards the second peripheral part n.

Thus, it is easy to apply based on this composite structure an energy focused on the initial interface region n contiguous to the first peripheral part n in such a manner that the energy is locally absorbed by the thin layer n in order to locally liquefy a portion n of the thin layer n, the initial interface region n substantially becoming a solid-liquid interface region, then displace the energy input in parallel with the planar surface of the support substrate by gradually moving it away from the seed sample n in such a manner as to solidify the portion n liquefied beforehand upstream of the energy input according to the crystalline information of the seed sample n and in such a manner as to gradually displace the solid-liquid interface region n within the thin layer n.

According to a particular disposition of the invention, the thin layer n is constituted of a semi-conductor material, such as silicon or germanium, or a ferromagnetic or ferroelectric material
the support substrate is constituted of silicon or borosilicate glass, or a film of polymer, carbon or aluminum, and
the buffer layer n is constituted of silicon oxide or silicon nitride.

Preferably, the composite structure comprises a confining layer n arranged on the thin layer n in such a manner as to isolate the thin layer n from the atmosphere e: promote the propagation of the crystalline information. This confining layer n in fact prevents the superficial oxidation of the thin layer n in contact with the atmosphere and promotes the monitoring of the crystallization process by preventing the agglomeration of the material of the thin layer n when it is in liquid form.

Other aspects, purposes and advantages of the present invention will become more apparent upon reading the following description of different embodiments of the latter, given by way of non limiting examples and made with reference to the accompanying drawings. The figures do not necessarily respect the scale of all the represented elements so as to improve their readability.

In the rest of the description, for the sake of simplification, identical, similar or equivalent elements of the different embodiments bear the same numerical references.

FIGS. 1 to 6 schematically illustrate a first embodiment of the method according to the invention.

FIG. 7 schematically illustrates an alternative of the method according to the invention.

FIG. 8 schematically illustrates an alternative of the method according to the invention.

FIG. 15 illustrates an alternative of the method according to the invention.

FIGS. 16 to 19 illustrate a second embodiment of the method according to the invention, FIG. 20 further illustrates an alternative of the method according to the invention.

Figure 1:
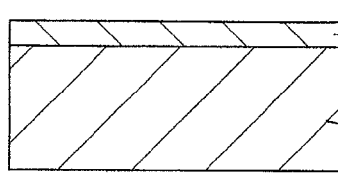

An example of crystallization of a thin layer n; 1 of amorphous silicon is now described in detail in accordance with FIGS. 1 to 6. As illustrated on FIG. 1, a buffer layer n; 2 of amorphous silicon oxide with a thickness of around 400 nm is deposited on a planar surface of a support substrate 3 of glass by CVD (Chemical Vapor Deposition), PECVD (Plasma Enhanced Chemical Vapor Deposition), LPCVD (Low Pressure Chemical Vapor deposition) or any other low temperature and low pressure method of deposition, easy to implement on support substrates 3 of large dimensions and/or sensitive substrates. This buffer layer n;2 of SiO2 exhibits a melting point higher than that of silicon.

In parallel, the seed sample n;4 is prepared based on a single-crystalline silicon substrate on the rear surface of which is deposited a hard mask 5, for example of silicon nitride by PECVD (Plasma Enhanced Chemical Vapor Deposition). This mask 5 serves in particular to protect the rear surface of the substrate from the chemical etching operated later on for fashioning the flanks 6 of the seed sample n;4. The silicon substrate is then cut out in such a manner as to form one or several seed samples 4 which are easy to manipulate, for example a sample n;4 exhibiting a surface of 3×3 mm$^2$ and a thickness of around 325 micrometers.

Figure 2:
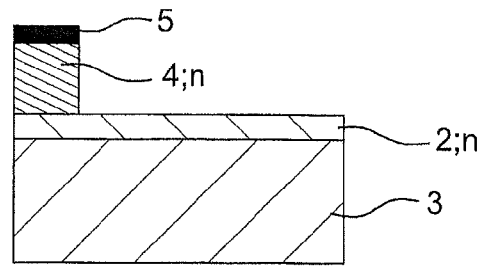

FIG. 2 illustrates the direct bonding of the front surface of the seed sample n;4 on a peripheral edge of the buffer layer n;2, following a prior chemical cleaning of the surfaces put in contact by typical cleaning sequences by solutions CARO (H$_2$SO$_5$), and/or RCA. An annealing for strengthening the bond and degassing is then achieved for example around 400° C. for a duration of a few minutes to a few hours under nitrogen atmosphere.

Figure 3:
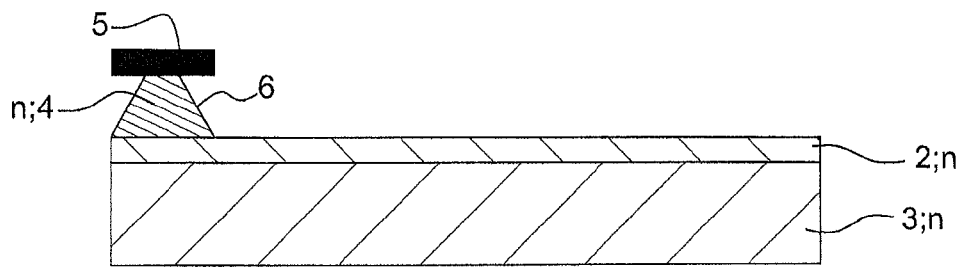

FIG. 3 illustrates the chemical etching operated on the seed sample n;4 in such a manner as to obtain the configuration of the flanks 6 required for the later obtaining an initial interface region 7 with the thin layer n;1 exhibiting a large contact surface between the thin layer n;1 to crystallize and the single-crystalline material for the volume of the formed initial interface region 7. The application of a solution of potassium hydroxide KOH on the sample n; 4 in single-crystalline silicon of symmetry <100> allows in particular to obtain flanks 6 exhibiting an even slope forming a bevel. The size of the bevel depends on the concentration of KOH in the etching solution and the dimension of the sample n; 4. The rear planar surface of the sample n; 4 protected by the nitride mask 5 is not etched.

Figure 4:
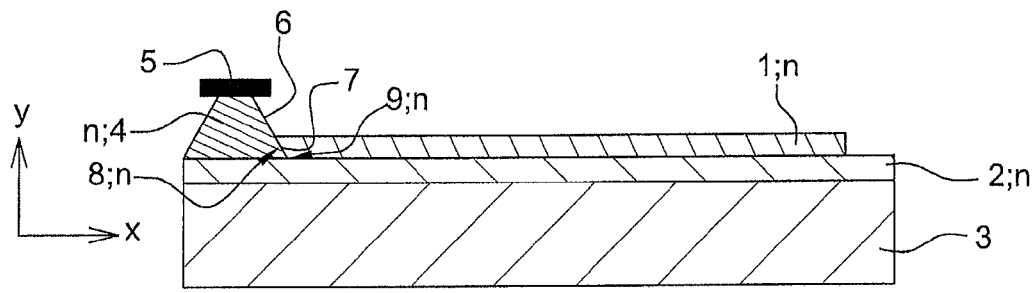

FIG. 4 illustrates the partial etching of the mask 5 of Si3N4 by a phosphoric acid solution H3PO4 in such a manner as to expose and be able to cover at least partially the flanks 6 of the seed sample n; 4 by deposition of a thin layer n; 1 of amorphous silicon. The deposition of the thin layer n; 1 is achieved by a cheap deposition technique such as LPCVD until attaining a thickness of around 200 nm. The interface thus formed in this embodiment is oblique and rectilinear. The initial interface region n; 7 is interposed, along a direction parallel with the planar surface of the support substrate, between a first peripheral part n; 8 solely comprising the seed sample n; 4 and a second peripheral part n; 9 solely comprising the thin layer 1. The proportion of seed sample decreases in a linear fashion and continues until it disappears towards the second peripheral part n; 9. This particular sizing of the initial interface region 7 allows a large contact surface with the thin layer n; 1 in such a manner as to promote the later transmission of the crystalline information.

Figure 5:
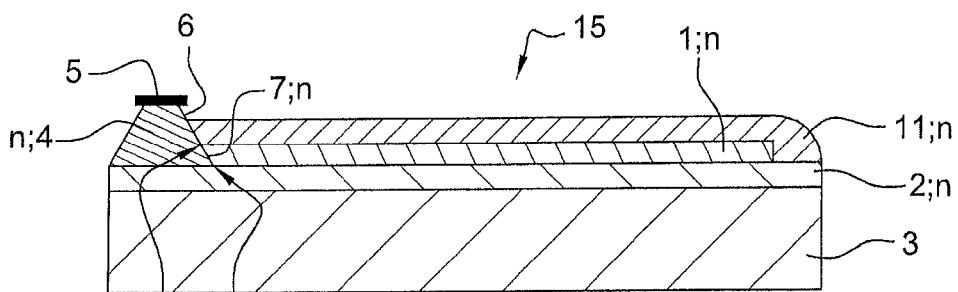

FIG. 5 illustrates a partial new etching of the mask 5 of Si3N4 by a solution of H3PO4 in such a manner as to expose the initial interface region n; 7 and deposit a confining layer n; 11 in amorphous material SiO2 on the thin layer n; 1 of which the initial interface region 7. The confining layer n; 11 is deposited with a thickness of 400 nm by a cheap deposition technique such as LPCVD.

According to a non illustrated alternative, the mask 5 of $Si_3N_4$ is totally etched at the step illustrated on FIG. 4 in such a manner that the totality of the rear surface of the sample n; 4 is exposed, thus facilitating the subsequent deposits of layers.

Figure 6:
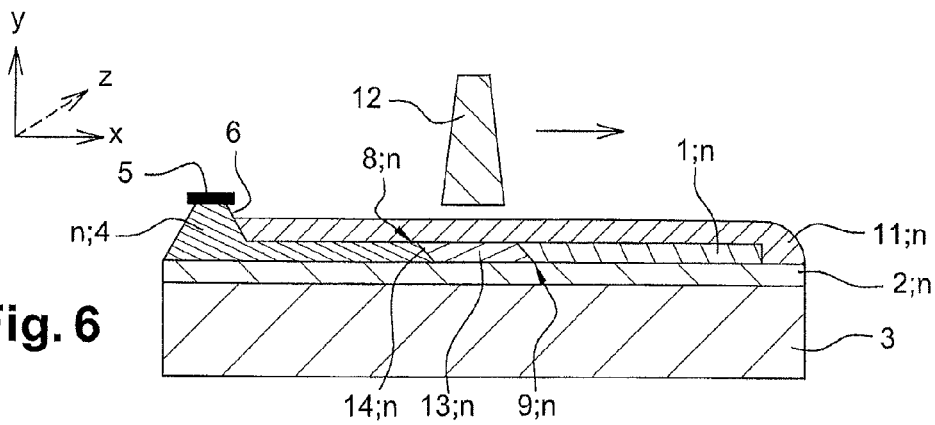

FIG. 6 illustrates a step consisting in locally providing energy to the thin layer n; 1 by means of a radiation 12 from a laser beam emitting at a wavelength of absorption of the silicon of/from the thin layer n; 1 and for which the confining layer n;11 and the buffer layer n;2 in SiO2 are totally transparent. The wavelengths in the UV are suitable. The laser may be continuous or pulsed. It may also be a UV pulsed laser, for example XeCl emitting at the wavelength of 308 nm. The beam 12 from the laser sweeps the entire surface with a frequency of 6000 Hz, an energy of 150 mJ, a power of 900 W and a pulse overlap of 60%, in a direction ranging from the first peripheral part n; 8 of the initial interface region n;7 towards the second peripheral part n; 9 by moving away from the seed sample n; 4 and beyond. The local portion n; 13 of the illuminated thin layer n; 1 absorbs the energy and causes a thermal agitation of the thin layer 1. The local increase in temperature in the local illuminated portion n; 13 leads to melting of the material and liquefaction of a portion n; 13 of the thin layer 1. The single-crystalline seed sample n; 4 having a melting point higher than that of the amorphous material, the seed sample n; 4 does not liquefy, or only in a very low proportion. The initial interface region n; 7 hence substantially becomes a solid-liquid interface region n; 14. Furthermore, the displacement of the beam 12 generates the solidification by cooling of the portion n; 13 liquefied upstream of the beam 12, based on the crystalline information from the seed n; 4. While solidifying, the material of the thin layer n; 1 becomes organized and forms a Bravais lattice duplicating the crystalline print provided by the seed sample n; 4. In addition, the large contact surface between the thin layer n; 1 and the seed sample n; 4 for an initial interface region n; 7 of given dimensions, contributes to the propagation of the crystalline information of the seed sample n; 4 during cooling of the thin layer 1. Thus, the solidified region acts as an extension of the seed sample n;4 and the solid-liquid interface n; 14 is displaced with the displacement of the beam 12 while propagating the crystalline information of the seed n;4. The crystallization front 14 substantially exhibits the same configuration as that of the initial interface region n;7 (and the flanks 6) and propagates without interruption by following the illuminated portion n; 13 in the thin layer 1. The crystalline information of the seed n; 4 is thus propagated over the totality of the thin layer n; 1 by one single crystallization front 14.

The thin single-crystalline layer n; 1 obtained hence exhibits a very good crystalline quality and a surface of which the roughness peak-valley is lower than 10 nm with a variation of more or less 3 nm RMS.

In a non represented alternative, the confining layer n; 11 is formed of a thick substrate exhibiting a thickness in the range of 100 to 700 µm for example, and transparent to the wavelength of the laser used to liquefy the thin layer 1, such as a glass substrate. This thick substrate 11 hence exhibits a mechanical stiffness sufficient for supporting the thin layer 3 and allows dissociating the support substrate 3 from the thin layer 1. It may in particular be provided to remove by grinding all or part of the support substrate 3 in such a manner as to obtain the thin layer n; 1 on the thick substrate 11.

Figures 7, 8:
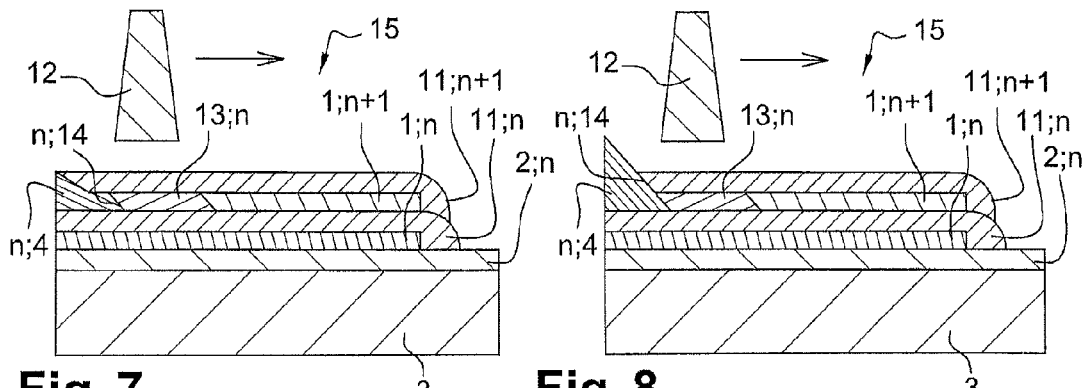

According to a possibility illustrated on FIG. 7, the initial thin layer n; 1 is in germanium with a first seed sample n also in germanium. The wavelengths suitable for being absorbed by the germanium range from the infrared to the UV. The same laser as the one previously described may hence be used. A second thin layer n+1; 1 of a semi-conductor amorphous silicon material is crystallized by energy input according to the aforementioned method. The confining layer n; 11 of amorphous SiO2 previously deposited on the thin layer n;1 of silicon is used as a buffer layer n+1; 2 on which a second seed sample n+1; 4 of silicon is bonded then etched in such a manner as to exhibit flanks 6 allowing to form the initial interface region n; 7 configured as described before. The second thin layer n+1; 1 in amorphous silicon is deposited by LPCVD on a thickness of 200 nm. A second confining layer n+1; 11 of amorphous SiO2 is also deposited by CVD in such a manner as to encapsulate the new initial interface region 7 and the second thin layer n+1; 1. A local irradiation by moveable beam 12 according to the same conditions as those described beforehand is applied in such a manner as to liquefy the silicon, then solidify it by cooling in contact of the single-crystalline seed sample n+1; 4 in such a manner as to cause the crystallization thereof and propagate the crystalline information of the seed n+1; 4 with the advance of the solicitation front or solid-liquid interface region n; 14 within the thin layer n+1; 1 of silicon, according to the displacement of the beam 12.

Thus, it is possible to form several levels of thin single-crystalline layer n; n+1; 1 of different or identical materials depending on the targeted applications.

Advantageously, the initial seed sample n; 4 exhibits a macroscopic characteristic such that the thickness thereof may be sufficient for being able to be used as seed sample n+1; 4 for the different levels of thin layers n; n+1; 1, in particular when the thin layers n; 1 and n+1; 1 are constituted of identical materials.

According to an alternative embodiment illustrated on FIG. 8 the seed n; 4 is joint to the thin layers n; 1 and n+1; 1 to be re-crystallized. This unique macroscopic seed gives the possibility of re-crystallizing several hundred nanometric layers.

Figure 9:
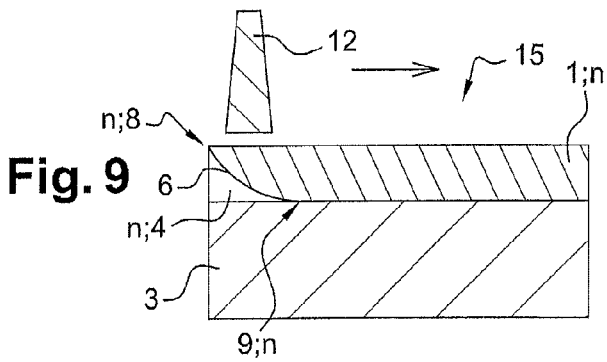
FIGS. 9, 10 and 11 illustrate alternatives of composite structures suitable for implementing the method of the invention.

FIG. 9 illustrates a composite structure 15 suitable for the producing a thin single-crystalline layer n; 1 on a support substrate 3 according to an alternative embodiment of the invention. The composite structure 15 comprises a support substrate 3 in borosilicate glass at the periphery of which is disposed a seed sample n; 4 in single-crystalline silicon. The flanks 6 of the seed sample n;4 were prepared beforehand by chemical etching executed with an etching agent such as HNA (acid mixture comprising HF, $HNO_3$ and $CH_3COOG$) in such a manner as to exhibit flanks 6 of a concave surface.

A thin layer n; 1 in amorphous semi-conductor silicon material is then deposited by LPCVD directly at the surface of the support substrate 3, in the absence of a buffer layer n; 2. The support substrate 3 being constituted of an amorphous material, it does not exhibit parasitic nucleation sites for the crystallization of the thin layer 1.

Due to the flanks 6 of the seed sample n; 4, the initial interface region 7 between the thin layer n; 1 and the seed n;4 hence exhibits a proportion of seed sample n;4 and a proportion of thin layer n; 1 variable according to a direction parallel with the planar surface of the support substrate 3. The proportion of seed sample n;4 in fact decreases from a first peripheral part n; 8 towards a second peripheral part n; 9 framing the initial interface region 7. This configuration of the initial interface region 7 thus allows a contact on a large surface between the seed material n; 4 and the material of the thin amorphous layer n; 1.

A beam 12 of a laser irradiating at 308 nm then illuminates the thin layer 1. The irradiation is achieved as described previously by sweeping based on the initial interface region n; 7 contiguous to the first peripheral part n; 8 towards the second peripheral part n; 9 and finally by moving away from the seed sample 3, on the rest of the thin layer 1. The thin layer n; 1 then heats up locally until becoming liquefied on a local illuminated portion n; 13, while the seed sample n; 4 largely keeps its solid and single-crystal characteristic. The support substrate 3 being constituted of a thermal insulating material, it forms an insulating barrier and horizontally confines the heating of the thin layer n; 1 irradiated according to the displacement of the beam 12. This promotes one single crystallization front by displacing the solid-liquid interface n; 14 and optimizes the crystalline quality obtained by avoiding the generation of defects resulting from the meeting of several solidification fronts. This insulating feature, allows preventing the heating of the support 3 during the liquefaction of the thin layer 1. This advantageously prevents inducing thermomechanical constraints in the thin layer n; 1 which may lead to the formation of defects during cooling. When the irradiation of the laser 12 reaches an area no longer comprising a seed sample n;4, the crystallization front 14 in the thin layer n; 1 continues to transmit the crystalline information of the seed n; 4 by contact with a portion of the thin layer n; 1 during solidification.

In this embodiment, the thin layer n; 1 is deposited in amorphous form by a cheap deposition method but the method of the invention may be used based on thin singe-crystalline layers 1 of poor quality for example or thin poly-crystalline layers 1. The melting of the local portion n; 13 is more complex to monitor as the distribution of heat is not uniform due to the presence of grain boundaries in the material but once reached, the layer 1 may be re-crystallized efficiently based on the crystalline information of the seed sample n; 4.

Thus, the seed sample n; 4 may be directly disposed on the support substrate 3 when the latter is formed of an amorphous material which is also a good thermal insulator. According to a non illustrated alternative embodiment, the seed sample n; 4 may be formed prior to the deposition of the thin layer n;1 by micro-machining the support substrate 3. Furthermore, the size of the seed sample n; 4 is the result of a compromise between the cost of the single-crystalline material used and the difficulty of manipulating a sample with overly small dimensions. A sample with small dimensions will in particular necessitate the use of a specific and expensive equipment. A middle ground is found for example with a seed sample n; 4 of a surface of a few square millimeters on a thickness of a few hundred microns for example. These dimensions are clearly sufficient for propagating the crystalline information over the entire surface of the thin layer n; 1 when the configuration of the initial interface region n; 7 such as described before is respected.

Figure 10:
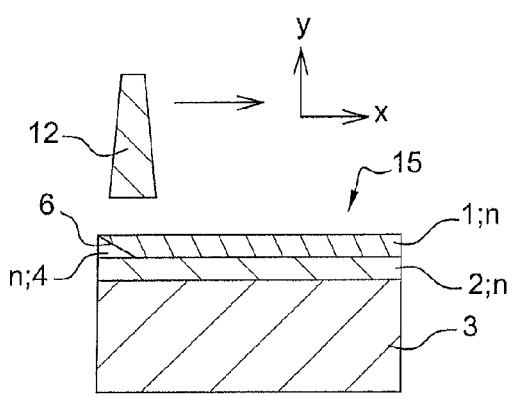

FIG. 10 illustrates an alternative embodiment implemented on a composite structure 15 comprising a buffer layer n; 2 inserted between an assembly constituted of the silicon seed sample n; 4 and the thin layer n; 1 in amorphous silicon and a substrate support 3 in glass. This method further applies the energy source 12 focused directly on the exposed surface of the thin layer 1, in the absence of confining layer n; 11.

The buffer layer n; 2 is formed in a material of amorphous SiO2 in such a manner as to avoid creating parasitic nucleation sites and limit the deposition costs. The buffer layer n; 2 advantageously exhibits a melting point (1600° C.) higher than that of the thin layer n; 1 (1414° C.) in such a manner as not to interfere in the crystallization process of silicon. Furthermore, the buffer layer n; 2 is advantageously achieved in a thermal insulating material such as to confine the energy locally provided to the system. The minimum thickness of the buffer layer n; 2 is hence conditioned by its efficient thermal insulation and its ability to prevent a vertical thermal dissipation. The maximum thickness has no limits as the buffer layer n;2 may entirely form the support substrate 3. Combined with the use of a directional energy source 12, this confinement allows keeping a horizontal temperature gradient in the thin layer n; 1 and a crystallization front 14 allowing the liquefied area 13 to keep a contact with a solid portion exhibiting the crystalline information of the seed sample n; 4. Thus, the presence of this buffer layer n; 2 allows a greater freedom of choice of the material constituting the support substrate 3 and allows the use in particular of cheap substrates, non transparent to the wavelength of the used laser 12.

Figure 11:
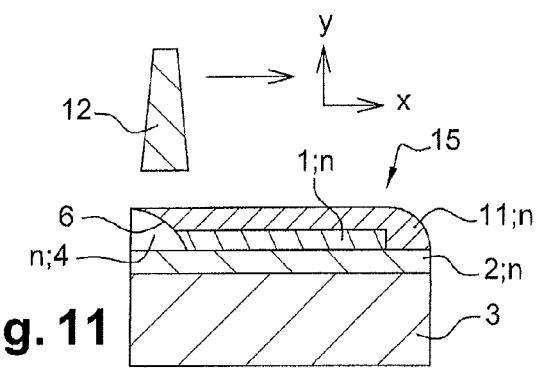

The FIG. 11 illustrates a composite structure 15 suitable for the crystallization of a thin layer n; 1 comprising a seed sample n; 4, of which the flanks 6 exhibit a convex surface, on the buffer layer n; 2 and a thin layer n; 1 encapsulated by a confining layer n; 11 also covering the initial interface region 7. This confining layer n; 11 is formed in an amorphous material in such a manner as to limit the deposition costs and prevent the creation of parasitic nucleation sites. The confining layer n; 11 exhibits at the most a low absorption coefficient of the energy provided to the composite structure 15 in such a manner that the beams 12 may cross it to mainly irradiate the thin layer 1. In this way, the speed and quality of the energy input to the thin layer n; 1 is optimized. Like the buffer layer n; 2, the confining layer n; 11 exhibits a melting point higher than that of the thin layer 1. The confining layer allows preventing the agglomeration phenomena liable to appear on the thin liquefied layer n; 1 when the surface thereof is not protected, these phenomena able to lead to rupture of the propagation of the crystalline information. The confining layer n; 11 further allows preventing all chemical interactions between the thin layer n; 1 and the atmosphere (oxidation, absorption . . . ) which may disrupt the crystallization process. Furthermore, when the confining layer n;11 exhibits dewetting properties with respect to the liquid phase of the thin layer 1, the contracted liquid phase is repulsed towards the seed sample n; 4 or towards the crystallized layer 1. A good contact with the sample n; 4 is kept and a good transmission of the crystalline information takes place.

Figure 12:
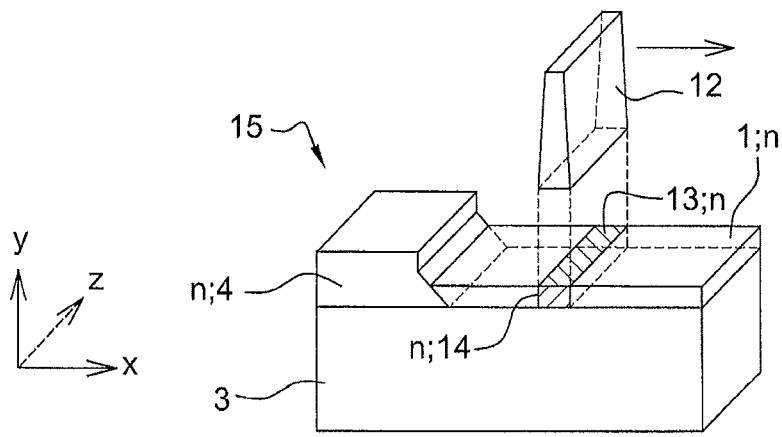
FIG. 12 is a perspective view of an embodiment of the invention.

The FIG. 12 is a perspective illustration of a composite structure 15 in which the seed sample n; 4 exhibits a length substantially equal to the width of the support substrate 3 along the axis z and extends transversally in the vicinity of a transversal edge of the planar surface of the support substrate 3. The thin layer n; 1 is deposited on the support substrate 3 in such a manner as to form an initial interface region 7 such as defined beforehand with the sample n; 4. The used beam 12 exhibits a width lower than that of the initial interface region n; 7 and a length substantially equal to the width of the support substrate 3 and hence of the width of the thin layer n; 1 along axis z. The irradiation hence consists in a unique sweeping of the totality of the surface of the thin layer n; 1 in parallel with the planar surface of the support substrate 3 (along axis x) starting by the initial interface region n; 7 contiguous to the peripheral part n; 8. This embodiment allows the propagation of a single crystallization front 14 formed at the initial interface region 7 and extending over the entire width of the thin layer n; 1 (along axis z). It is also represented on FIG. 12, a seed sample n; 4 machined on only a low proportion with a view to recycling the latter.

Figure 13:
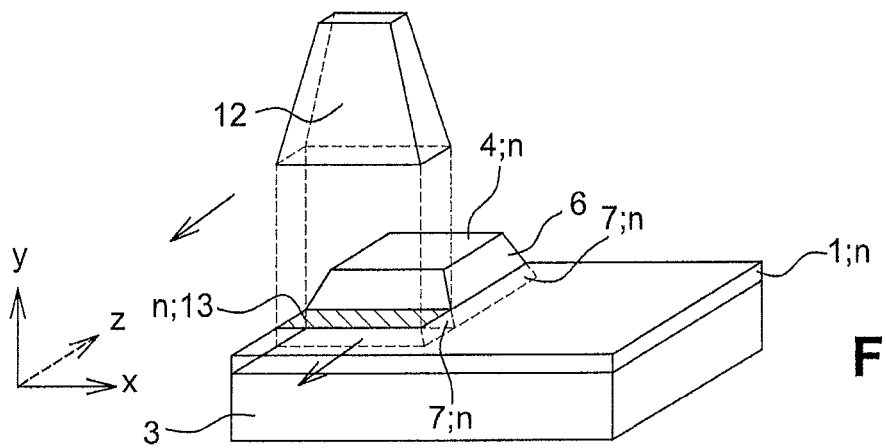
FIGS. 13 and 14 illustrate according to a perspective view of an alternative of the method of the invention.
Figure 14:
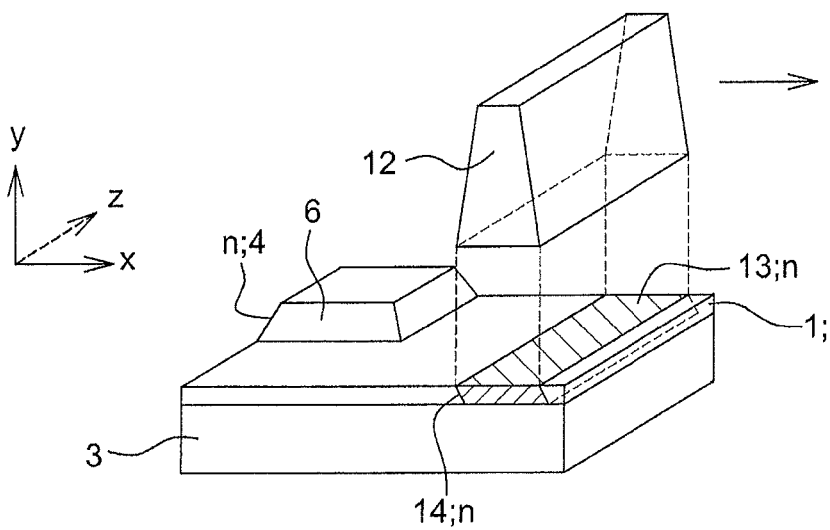

FIGS. 13 and 14 illustrate a perspective view of a composite structure 15 comprising a seed sample n; 4 disposed in an angle of the support substrate 3 and exhibiting lateral dimensions lower than the width (along axis z) and the length of the support substrate 3 (along the axis x). The configuration of the seed sample n; 4 is designed in such a manner as to form with the thin layer n; 1 first and second initial interface regions 7, 7' such as defined beforehand. A first sweeping of a laser beam 12 exhibiting a length similar to the dimension of a lateral peripheral side of the sample n; 4 (along the axis z) is started based on a first initial interface region n; 7. This first sweeping leads to crystallizing a first part of the thin layer n; 1 by forming an extension of the seed sample n; 4 in the continuity of the second initial interface region n; 7'.

A second sweeping along the axis x is then achieved from the second initial interface region 7' extended by the first part of thin layer n; 1 having just been crystallized with a beam 12 of which the length is similar to that of the second extended region 7'. A second part of the thin layer 1, complementary to the first part, is then crystallized. Thus, it is possible that two successive sweepings of a beam 12 be achieved along the axis z then along the axis x, for example in such a manner as to propagate one single crystallization front 14 comprising one single crystalline information.

According to another non illustrated possibility, once the first sweeping along the axis z is carried out and the initial interface region n; 7 is formed, the seed sample n; 4 is removed in order to be recycled. A sweeping along the axis x may be achieved from the second initial interface region 7' in such a manner as to propagate the crystalline information for the crystallization of the second part of the thin layer 1.

According to another non illustrated embodiment, a seed sample n; 4 extends transversally and in the center of a support substrate 3, the seed sample n; 4 exhibiting a length substantially equal to the width of the support substrate 3. A thin amorphous layer n; 1 is deposited in such a manner as to create first and second interface regions 7; 7' on either side of the seed sample n; 4. Two beams 12 exhibiting a length similar to the length of the seed sample n; 4 are hence used at the same time to sweep the thin layer n; 1 from the two initial interface regions 7; 7' by starting from the center of the support substrate 3 and by moving away from the seed sample n; 4 towards the peripheral sides of the support substrate 3. In this way, the cycle time of the method for producing a thin layer n; 1 is highly reduced.

As seen on FIGS. 5, 9, 10 and 11, the surfaces of the flanks 6 may be oblique and exhibit an even linear slope, a concave or convex surface. However, the seed sample n; 4 may be prepared in such a manner as to exhibit any configuration of flanks 6 suitable for obtaining an initial interface region n; 7, 7' as described before, namely any configuration allowing the decrease by gradient, variable or not, of the proportion of seed sample n; 4 in the initial interface region n; 7, 7'.

FIG. 15 illustrates an alternative of the step c) of the method in which the thin layer n; 1 comprises doping species. These doping species may be introduced in the thin layer n; 1 during the deposition of the thin layer, in such a manner that it is easy to form a stacking of sub-layers, within the thin layer, each comprising a concentration of doping species or a different nature of doping species. According to another non illustrated possibility, the doping species are introduced by implantation or plasma immersion which advantageously allows monitoring locally, laterally and in depth, the concentration and the nature of the doping species introduced in the thin layer 1. The energy input according to steps s) and f) of the method allows the electric activation of the doping species during the same period as the thin layer is crystallized. The duration of the energy input for the crystallization being locally very short, in particular when it is carried out by electron gun or by laser, the doping species hardly diffuse in the thin layer n; 1. Thus, the profile of the activated doping species is very precise.

FIGS. 16 to 19 illustrate an alternative embodiment combined with a method of "roll-to-roll" type. The step a) consists in providing a flexible substrate wound around itself in such a manner as to exhibit a roller shape extending along the axis z such as illustrated in FIG. 16. Part of the flexible substrate is unwound (FIG. 17) in such a manner as to provide a support substrate 3 comprising a planar surface and allow the disposition of the seed sample n; 4 according to the step b) and the deposition of the thin layer 1 according to the step c) of the method. Then, as the flexible substrate is unwound, the thin layer is deposited and an energy input is applied, for example by stationary laser beam 12, starting by the initial interface region n; 7 between the thin layer n; 1 and the seed sample 4. As illustrated on FIG. 18, the support substrate 3 is displaced along the direction indicated by the axis x (step f) with respect to the energy input source 12 and with respect to the immovable device allowing the deposition of the thin layer n; 1. The movement of the support substrate 3 is preferably implemented in such a manner that the planar surface exhibits at least one dimension similar to that of the energy input when the planar surface receives the energy input.

Thus, the locally liquefied thin layer is then locally crystallized by the moving away thereof from the energy source, on the basis of the crystalline information of the seed sample n; 4.

FIG. 19 illustrates a step n) of the method in which the assembly comprising the support substrate 3 and the crystallized thin layer n; 1 is wound around itself again in such a manner as to exhibit a general roller shape.

According to a non illustrated alternative arrangement, the method comprises a step m) consisting in carrying out collective surface treatments on the support substrate 3 covered by the non wound thin layer n; 1. Hence, it is possible to carry out the cutting out of plates of large dimensions from the support substrate 3 covered with the thin crystallized layer n; 1, for achieving for example solar panels.

Furthermore, according to a non illustrated possibility on FIGS. 16 to 18, a buffer layer n; 2 is deposited on the planar face before the deposition of the thin layer n; 1 and a confining layer n; 11 is deposited on the thin layer n; 1 before the latter is exposed to the energy input.

FIG. 20 illustrates an alternative embodiment in which the support substrate 3 comprises a first planar surface and a second planar surface. A first seed sample n; 4 is disposed on the first planar surface then a first thin layer n; 1 is deposited on the first planar surface in such a manner as to create a first initial interface region n; 7. A second seed sample n; 4 is disposed on the second planar surface then a second thin layer n; 1 is deposited on the second planar surface in such a manner as to create a second initial interface region n; 7. Two energy input sources, such as two laser beams, located on either side of the support substrate 3 respectively irradiate the first thin layer n; 1 and the second thin layer n; 1 in such a manner as to simultaneously achieve the crystallization of the first and second thin layers 1. According to another alternative embodiment, the irradiation of the first and second thin layers 1 is shifted in time.

Thus, the method of the invention proposes a low cost method for the steps employed as well as for the raw material consumed. The method is easy to implement on large dimensions, is flexible as regards the nature of the support substrate 3. It is also suitable for a wide range of materials, in particular semi-conductor materials, and repeatable several times on a same support substrate 3 thus allowing the formation of several thin single-crystalline layers 1 which may be of the same nature of a different nature. The method further ensures a very good monitoring of the crystallization process thanks to a physic-chemical and geometric confining of the thin layer n; 1 to be crystallized. This confining doubled by the use of a focused and directional energy input 12 allows the total transformation of a layer 1 in a material in particular semi-conductor material, preferably amorphous, in intimate contact with a single-crystalline seed n; 4 into a layer of single-crystalline material of very good quality.

It goes without saying that the invention is not limited to the embodiments described above by way of examples but it comprises all the technical equivalents and alternatives of the means described as well as their combinations.

The invention claimed is:

1. A method for producing a thin single-crystalline layer n, the method comprising the steps of:
    a) providing a support substrate comprising a planar surface,
    b) placing a seed sample n in single-crystalline material exhibiting a crystalline information, on the planar surface, n being an integer different from zero,
    c) depositing a thin layer n on the planar surface such as to form an initial interface region n comprising a proportion of seed sample n and a proportion of thin layer n, the initial interface region n being framed on either side, and in parallel with the planar surface, of a first peripheral part n comprising only the seed sample n and a second peripheral part n comprising only the thin layer n, the proportion of seed sample n according to the axis perpendicular to the planar surface, decreasing from the first peripheral part n towards the second peripheral part n, the initial interface region n constituting the totality of the contact surface between the seed sample n and the thin layer n,
    e) providing an energy input to the initial interface region n contiguous to the first peripheral part n such that the energy is locally absorbed by the thin layer n in order to locally liquefy a portion n of the thin layer n, the initial interface region n substantially becoming a solid-liquid interface region n, and
    f) ensuring a relative displacement of the energy input and the support substrate, in parallel with the planar surface, by gradually moving the energy input and seed sample n away in order to solidify the portion n, which has been previously liquefied upstream of the energy input, according to the crystalline information of the seed sample n and in such a manner as to gradually move the solid-liquid interface region n within the thin layer n.

2. The producing method according to claim 1, wherein the step a) comprises a step of forming a buffer layer n on the planar surface of the support substrate and on which the thin layer n is deposited, the buffer layer n exhibiting an amorphous material at the interface with the thin layer n.

3. The producing method according to claim 1, wherein the step c) consists in depositing the thin layer n in the form of an amorphous material.

4. The producing method according to claim 1, wherein the thin layer n is formed of a semi-conductor material.

5. The producing method according to claim 1, wherein the energy input is achieved by means of at least one source of radiation.

6. The producing method according to claim 1, wherein the method comprises between the step c) and the step e) a step d) consisting in depositing and arranging a confining layer n on the thin layer n in such a manner as to isolate the thin layer n from the atmosphere and promote the propagation of the crystalline information.

7. The producing method according to claim 1, wherein the method comprises the steps consisting in:
    g) forming a buffer layer n+1 on the thin layer n in such a manner that the surface opposite the thin layer n of the buffer layer n+1 exhibits an amorphous material,
    h) placing a seed sample n+1 on the buffer layer n+1,
    i) depositing a thin amorphous layer n+1 on the buffer layer n+1, the buffer layer n+1 exhibiting an amorphous material at the interface with the thin layer n+1 such as to form an initial interface region n+1 with the seed sample n+1, the initial interface region n+1 comprising a proportion of seed sample n+1 and a proportion of thin layer n+1, the initial interface region n+1 being framed on either side and parallel with the planar surface, of a first peripheral part n+1 comprising only the seed sample n+1 and a second peripheral part n+1 comprising only the thin layer n+1, the proportion of seed sample n+1 along the axis perpendicular to the planar surface, decreasing from the first peripheral part n+1 towards the second peripheral part n+1, j) providing an energy input to the initial interface region n+1 contiguous to the first peripheral part n+1 in such a manner that the energy is locally absorbed by the thin layer n+1 in order to liquefy locally a portion n+1 of the thin layer n+1, the initial interface region n+1 substantially becoming a solid-liquid interface region n+1, and k) ensuring a relative displacement of the energy input and the support substrate parallel with the planar surface by gradually moving the energy input and the seed sample n+1 away in order to solidify the portion n+1, which has been previously liquefied upstream of the energy input, according to the crystalline information of the seed sample n+1 and in such a manner as to gradually displace the solid-liquid interface region n+1 within the thin layer n+1.

8. The producing method according to claim 7, wherein the step i) comprises the deposition of a confining layer n+1 on the thin layer n+1.

9. The producing method according to claim 7, wherein the seed sample n+1 is formed by the seed sample n.

10. The producing method according to claim 7, wherein the thin layer n+1 is formed of a material which is different from the material of the thin layer n.

11. The producing method according to claim 7, wherein the producing method comprises a step l) consisting in repeating the steps h) to k), the integer n being incremented by a unit.

12. The producing method according to claim 8, wherein the method comprises between the step c) and the step e) a step d) consisting in depositing and arranging a confining layer n on the thin layer n in such a manner as to isolate the thin layer n from the atmosphere and promote the propagation of the crystalline information, and wherein the buffer layer n+1 is formed by the confining layer n and in that the surface opposite the thin layer n+1 of the buffer layer n+1 exhibits an amorphous material.

13. The producing method according to claim 1, wherein the thin layer n comprises first and second initial interface regions n with the seed sample n and in that the steps e) to f) are achieved on the first initial interface region n in such a manner as to crystallize a first part of the thin layer n and form an extension of the seed sample n in the continuity of the second initial interface region n, then the steps respectively e) to f) are achieved on the second initial interface region n extended by the first crystallized part of the thin layer n in such a manner as to crystallize a second part of the thin layer n complementary to the first part.

14. The producing method according to claim 1, wherein the step c) comprises the deposition of a thin layer n comprising doping species, achieving steps e) and f) leading to electrically activate at least part of the doping species of the thin layer n.

15. The producing method according to claim 1, wherein the step c) comprises a step of implanting doping species in the thin layer n achieving steps e) and f) leading to electrically activate at least part of the doping species of the thin layer n.

16. The producing method according to claim 1, wherein the method comprises a step m) after the step f) consisting in carrying out collective surface treatments on the thin layer n.

17. The producing method according to claim 1, wherein the step a) comprises a step consisting in providing a flexible substrate wound around itself in such a manner as to exhibit a general roller shape, followed by a step consisting in at least partially unwinding the flexible substrate in such a manner as to provide the support substrate comprising the planar surface.

18. The producing method according to claim 17, wherein the method comprises a step n) achieved after the step f) consisting in winding the assembly comprising the support substrate and the thin layer n around itself such that the assembly exhibits a general roller shape.

19. The producing method according to claim 1, wherein
the step a) consists in providing a support substrate comprising a first planar surface and a second planar surface,
the step b) consists in placing a first seed sample n in single-crystalline material exhibiting a crystalline information on the first planar surface, and in placing a second seed sample n in single-crystalline material exhibiting a crystalline information on the second planar surface, and
the step c) consists in depositing a first thin layer n on the first planar surface, such as to form respectively a first initial interface region n comprising a proportion of the first seed sample n and a proportion of the first thin layer n, the first initial interface region n being framed on either side and in parallel with the first planar surface, of a first peripheral part n solely comprising the first seed sample n and a second peripheral part n solely comprising the first thin layer n, the first proportion of seed sample n along the axis perpendicular to the first planar surface, decreasing from the first peripheral part n towards the second peripheral part n,
and in depositing a second thin layer n on the second planar surface, in such a manner as to form respectively a second initial interface region n comprising a proportion of the second seed sample n and a proportion of the second thin layer n, the second initial interface region n being framed on either side and in parallel with the second planar surface, of a primary peripheral part n solely comprising the second seed sample n and a secondary peripheral part n solely comprising the second thin layer n, the second proportion of seed sample n along the axis perpendicular to the second planar surface, decreasing from the primary peripheral part n towards the secondary peripheral part n.

20. The producing method according to claim 7, wherein the thin layer n comprises first and second initial interface regions n with the seed sample n and in that the steps j) to k) are achieved on the first initial interface region n in such a manner as to crystallize a first part of the thin layer n and form an extension of the seed sample n in the continuity of the second initial interface region n, then the steps respectively j) to k) are achieved on the second initial interface region n extended by the first crystallized part of the thin layer n in such a manner as to crystallize a second part of the thin layer n complementary to the first part.

* * * * *